United States Patent [19]

Kramer

[11] 4,095,348
[45] Jun. 20, 1978

[54] DIGITAL COMPASS

[75] Inventor: Melvin G. Kramer, Riverton, Wyo.

[73] Assignee: The Brunton Company, Riverton, Wyo.

[21] Appl. No.: 740,389

[22] Filed: Nov. 10, 1976

[51] Int. Cl.² ............................................ G01C 17/26
[52] U.S. Cl. .................................. 33/363 K; 33/1 PT; 33/DIG. 3; 250/237 G
[58] Field of Search .............. 33/1 N, 1 T, 1 PT, 267, 33/363 K, DIG. 3; 250/237 G

[56] References Cited

U.S. PATENT DOCUMENTS

| 3,634,946 | 1/1972  | Star ..................................... 33/1 PT |
| 3,746,842 | 7/1973  | Fowler .............................. 235/92 CV |
| 3,746,843 | 7/1973  | Wesner ............................. 235/92 EA |
| 3,772,503 | 11/1973 | Fowler .............................. 235/150.5 |
| 3,825,823 | 7/1974  | Rovner .............................. 324/43 R |
| 3,833,901 | 9/1974  | Fowler .............................. 33/363 K |
| 3,950,859 | 4/1976  | Kramer ............................. 33/363 K |
| 3,995,156 | 11/1976 | Angerback et al. .............. 250/237 G |

Primary Examiner—Richard E. Aegerter
Assistant Examiner—Richard R. Stearns
Attorney, Agent, or Firm—John E. Reilly

[57] ABSTRACT

A hand-held digital compass employs an incremental encoder including a digit code disc and sensor unit which are so interrelated with a logic circuit as to permit automatic referencing of the compass when power is initially applied; and further permits use of an extremely small digit code disc which in cooperation with the sensor unit will permit digital recording of the direction and degree or extent of displacement of the compass in a given direction. The logic circuit employed is self-correcting for errors caused by input line noise and permits utilization of a simplified counting circuit for reading and digitally displaying degrees of movement between zero and 360°.

16 Claims, 6 Drawing Figures

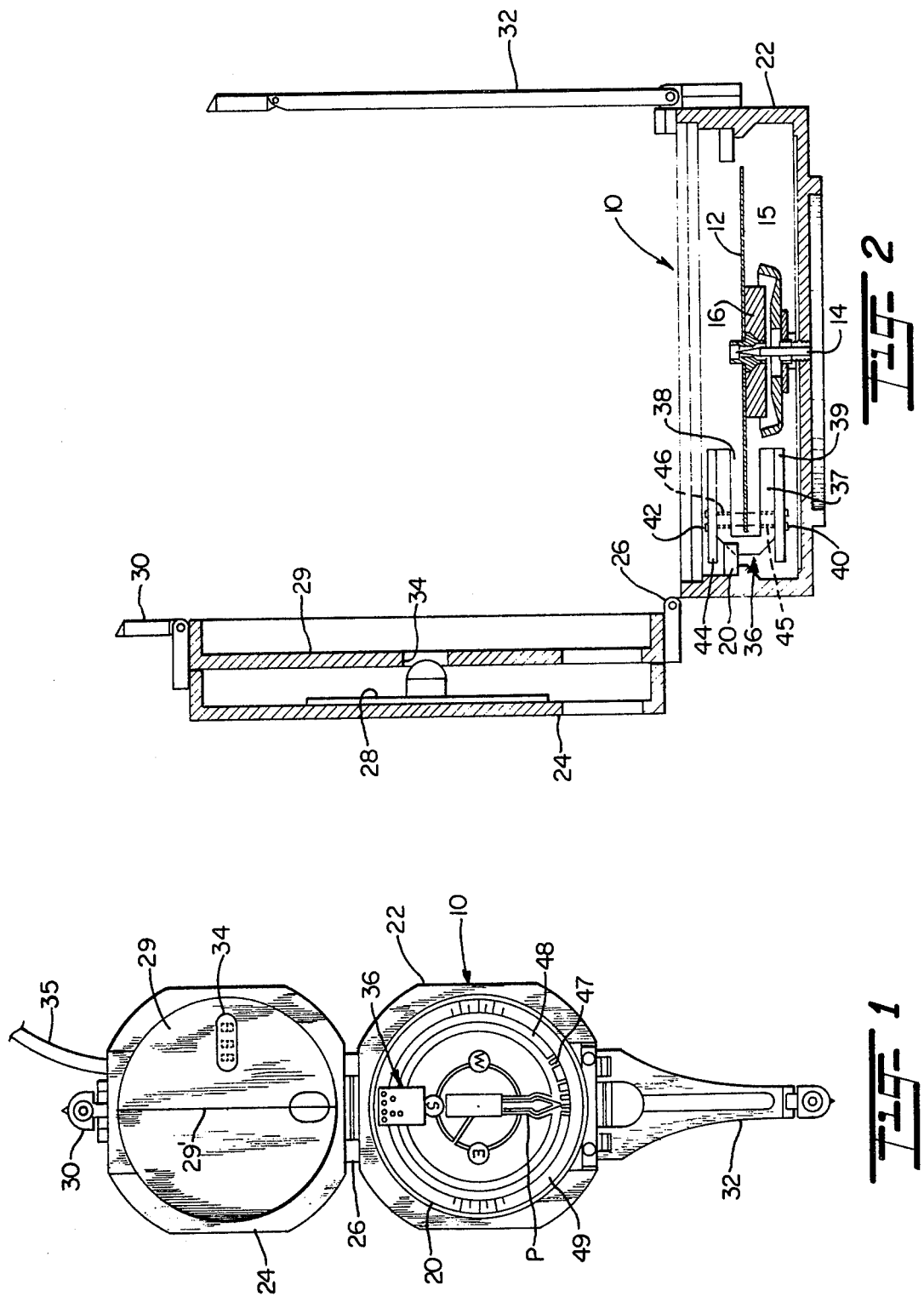

DIGITAL COMPASS

BACKGROUND OF THE INVENTION

This invention relates to position measuring instruments, and more particularly relates to digital compasses and the like specifically adaptable for use in measuring angular displacement relative to the earth's magnetic field.

Various instruments have been devised for determining compass directions and converting same into a numerical display of that reading. Such instruments conventionally include a pointer and graduated dial associated with a floating magnet so as to permit measurement of angular displacement for a given sighting relative to the earth's magnetic field. Digit code discs have also been utilized to follow movement of floating magnets and together with a sensor unit and associated logical circuitry provide a digital readout of the compass direction. For instance, this has been done by a combination of a light source and light sensitive detectors to sense incremental displacement of the digital code strip away from a reference line and counting the increments of movement away from the reference line through a counting circuit, for instance, as disclosed in U.S. Pat. No. 3,746,842 to Fowler. Other coded disc position indicating instruments are disclosed in United States Letters Patent No. 3,772,503 and 3,833,901 to Fowler. In addition, conversion of the incremental movement through the counting circuit into a digital display has also been suggested in U.S. Pat. Nos. 3,825,823 to Rovner and 3,746,843 to Wesner.

Typically, digital compasses are devised for determining the reference point of the compass; or in other words the horizontal angle between the direction of the pointer and magnetic north has been through absolute encoding systems which require that the digit code disc which is rotated by interaction of the attached magnets on the disc and the earth's magnetic field have a plurality of tracks or channels which would customarily include as many as twelve tracks for three-digit BCD information plus one strobe track. The advantage of this arrangement was that the position information was available immediately upon energization of the circuit since the disc carried the absolute angle information. However, this approach required a disc diameter which was determined by the minimum mounting distance of available sensors and emitters and the number of channels of information therefore increasing greatly the minimum permissible size of the compass. See for example United States Letters Patent No. 3,950,859, issued to Melvin G. Kramer, the applicant of the present invention and assigned to the assignee of this application.

It is therefore highly desirable to provide an incremental encoding system for a digital compass which will permit greatly reduced size of the digit code disc and sensor units and as a result greatly reduce the size, weight and power requirements of the entire compass unit. It is further highly desirable to provide such a system which is capable of immediately sensing the zero or reference position when the power is turned on and for accurately counting the direction and degree of displacement of the disc from that zero or reference point to provide an immediate reading of the compass direction.

SUMMARY OF THE INVENTION

It is therefore an object of the present invention to provide a position measuring instrument employing a novel and improved incremental encoding system for indicating the extent and direction of angular displacement of the instrument.

It is another object of the present invention to provide for a novel and improved digital compass which is extremely compact and being hand-held while providing immediate readings of compass directions with respect to an accurately defined zero or reference point.

It is a further object of the present invention to provide in a compass a digit code disc and sensor unit capable of sensing the number of least significant angle position movements relative to an accurately defined zero or reference point while simultaneously determining direction of movement of the disc.

It is a further object of the present invention to provide a position measuring instrument for an incremental encoder capable of measuring the direction and extent of angular displacement of the instrument at any given point in time and of providing a direction logic and counter circuit capable of converting such movement or displacement into numerical values while nullifying the effect of errors otherwise caused by input line noise in a greatly simplified manner.

It is an additional object of the present invention to provide in a position measuring instrument, such as a digital hand-held compass, an incremental encoder including a logic circuit capable of storing each signal generated by an increment of movement of a digit code disc and of comparing with each next signal in succession for determining direction of movement of the disc and wherein a counter circuit and digital readout are provided in combination therewith to provide for the conversion of angular increments of movement into degree readings from zero to 360°, the counting circuit being capable of counting up from 0° and down from 360° according to the direction of movement or displacement of the instrument away from the zero or reference position.

In accordance with the present invention, a preferred embodiment takes the form of a compact, hand-held digital compass which in addition to the conventional graduated scale and pointer, incorporates a digit code disc rotatable under the influence of a magnet and having a code strip thereon representing the least significant angle position movements of a compass from zero through 360°, all of which is contained on a single track or channel. An additional channel or track is provided for determination of the zero or reference point on the disc. Automatic sensing of the zero or reference position and consequent setting of a counting circuit to zero when the compass has reached its zero or reference position is achieved by energizing reference coils when power is initially turned on so as to cause the magnet to overcome the earth's magnetic field and advance the zero position of the disc into alignment with an external zero or reference setting on the body of the compass housing. When the disc reaches the reference position, a signal clears the counting circuit to cause it to read "zero" and simultaneously de-energizes the reference coils whereupon the disc is immediately responsive to the particular compass direction to be measured or read. The direction and extent of angular displacement of the disc is sensed by a pair of spaced sensors spaced an odd number of increments apart so that the electrical signals generated by the sensors are in out-of-phase relation to one another. Accordingly, the leading or lagging relationship of a signal generated by one sensor with respect to the other can be employed to convert the signals into a combination of signals which can be stored and simultaneously converted either into an up or down pulse representing direction of displacement of the disc. This pulse can then be used to advance the counting circuit in causing it to count either up or down according to the pulse received. Each next signal in succession generated by displacement of the disc relative to the sensor unit is compared with the last combination of signals to determine whether the direction of displacement is in the up or down direction and to generate the next successive up or down pulse according to the direction of displacement sensed.

Where a three decade counting circuit is used to permit readings of zero to one thousand, the present invention also employs position logic in the circuitry which is responsive to movement of the disc from 360° to 359° whereby to interrupt the normal counting sequence of the counter and cause it to count backwards from zero to 359°, as opposed to counting from zero to "999".

BRIEF DESCRIPTION OF THE DRAWINGS

Other objects, advantages and features of the present invention will become more apparent as the description proceeds, taken in conjunction with the accompanying drawings, in which:

FIG. 1 is a top plan view of a preferred form of digital compass in accordance with the present invention.

FIG. 2 is a side view partially in section and enlarged of a preferred form of compass shown in FIG. 1.

DETAILED DESCRIPTION OF THE PREFERRED EMBODIMENT

Figure 3:
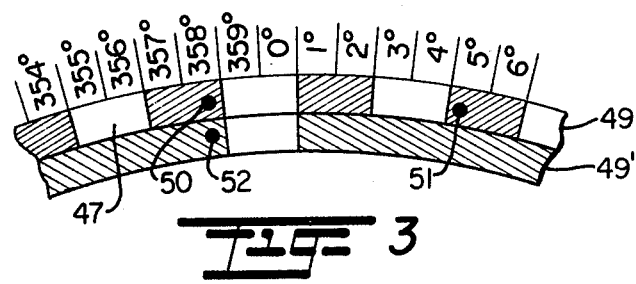
FIG. 3 is an enlarged fragmentary view of a portion of the sensing strips employed in association with the scale of the compass shown in FIGS. 1 and 2.

Referring in more detail to the drawings, there is shown in FIGS. 1 and 2 a preferred form of digital compass broadly comprised of a lower casing 10 in which is mounted a code disc 12 on a central pivot or needle bearing 14 with a dampener pan 15, and a pair of magnets 16 are disposed in closely spaced parallel relation to one another on the underside of the coded disc 12 all in a conventional manner. An azmuth ring 20 is positioned to extend circumferentially around the inner vertical sidewalls 22 of the lower casing directly above and just outwardly of the outer periphery of the code disc 12 which in a well-known manner is provided with degree readings together with manual adjustment means, not shown, to permit setting of the zero position on the scale to magnetic north.

A cover 24 is hinged as at 26 to the upper edge of the lower casing half, the cover 24 containing a display board 8, a mirror 29 with sight line 29' and a sight 30 at the end of the casing opposite to the hinge 26. A second sight member 32 is hinged to the vertical sidewall of the lower casing at a point diametrically or directly opposite to the hinge point 26 and in a well-known manner is adapted to be aligned with the sight 30.

A display window 34 is provided in the mirror panel 29 to present a digital display of compass readings and, to this end, the display board 28 has a power cord 35 extending to the necessary logical circuitry which is provided to decode sensor outputs received from a sensor unit 36 which is permanently affixed to the ring 20 in surrounding relation to the code disc 12. As broadly illustrated in FIGS. 1 and 2, the sensor unit includes an aperture plate 37 of generally U-shaped configuration to provide an open slot 38 through which the disc 12 advances with a lower mounting plate 39 secured to the lower end of the aperture plate for mounting of IR emitters 40 aligned with IR light sensors 42 in an upper mounting plate 44. The photosensitive emitters and sensors are aligned with collimated bores or openings 45 and 46, respectively, so as to collimate the passage of light through alternate transparent and opaque areas 47 and 48 formed on a circumferentially extending sensing strip 49 on the code disc 12.

Figure 4:
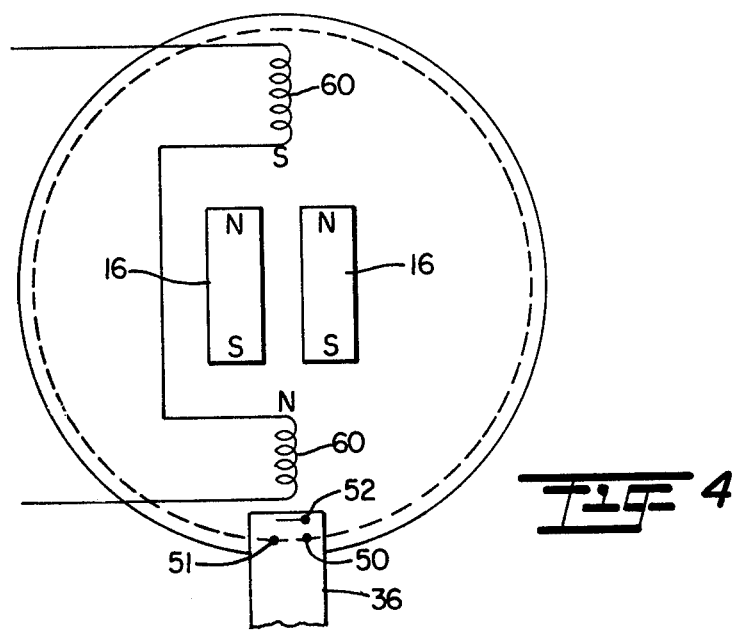
FIG. 4 is a somewhat schematic illustration of the reference coils and magnets employed in calibrating the scale.

Considering in more detail the disposition and relationship established between the disc and sensor, having reference to FIGS. 3 and 4, the disc 12 is journaled for rotation on the central pivot or needle bearing 14 to advance the sensing strip 49 consisting of the alternate light and dark areas with respect to the sensor unit 36. Preferably, the alternate light and dark areas are spaced apart 2° in relation to the degree readings on the scale 20, the latter conventionally provided with scale markings from 0° to 360° around its periphery. As represented in FIG. 3, the sensor unit 36 includes a pair of outer sensors 50 and 51 which are circumferentially spaced an odd number of degrees or increments apart from one another; and, as shown, are spaced apart 7° with respect to the degree readings on the scale. A third sensor 52 is spaced radially inwardly of the sensor 50 for use in association with the zero or reference position of the disc in a manner to be described. Generally, as the disc 12 rotates through the sensor unit 36, each sensor 50 to 52 will generate a signal as one of the light or transparent areas passes beneath the sensors; and since the sensors are disposed an odd number of increments or degrees apart, their signals are 90° out of phase. Thus, by summing up the signals are 90° out of phase. Thus, by summing up the signals from the sensors 50 and 51 at any given point, the direction of movement of the disc can easily be determined so as to cause the direction logic circuit to be hereinafter described to count either up or down from its previous reference setting.

Figure 5:
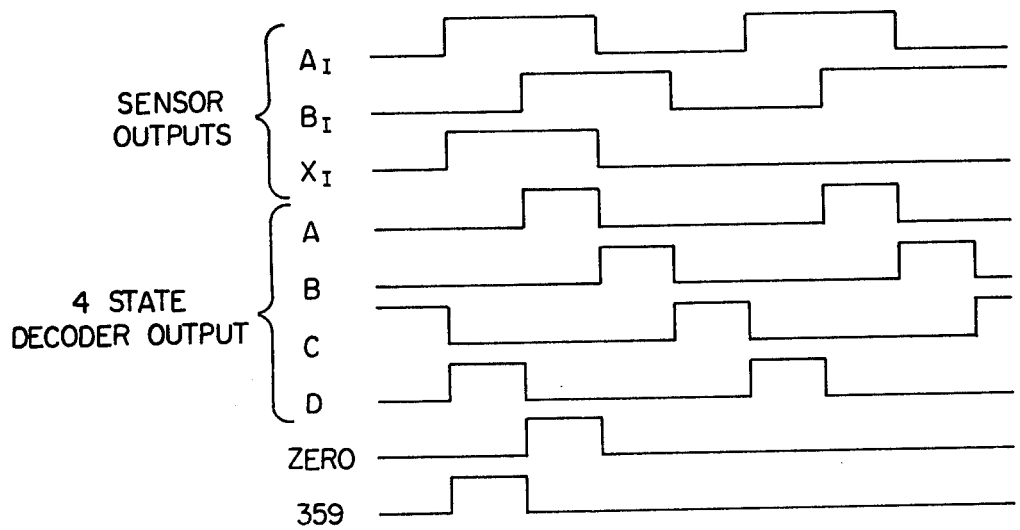
FIG. 5 is a timing diagram illustrating the interrelationship between the sensor outputs, decoder outputs and referencing signals.

Specifically, with respect to FIG. 3, it will be noted that if the disc 12 were caused to rotate in a counterclockwise direction, the sensor 50 will generate a signal 90° ahead of the sensor 51, since the sensor 50 will begin to sense the light area 47 while the sensor 51 is still aligned over a dark area 48. As a result of the out-of-phase relationship between the sensors, the individual signals generated can be decoded into four different timing signals labeled A, B, C, and D as in the timing chart of FIG. 5. For instance, when signal A is "high" such would represent the condition where both the sensors 50 and 51 are aligned over light areas; when signal B is "high" would represent a condition where sensor 50 is dark and sensor 51 is still light; when signal C is "high" would represent a condition where both sensors 50 and 51 are dark; and when signal D is "high" would represent a condition where sensor 50 is light and sensor 51 is dark. Thus the output from sensors 50 to 51 at any given point in time can be decoded and compared with stored outputs corresponding to the last sampling time as hereinafter described and from this direction of movement can be readily determined.

Disposition of the sensor 52 in alignment over the inner portion 49' of the sensor strip affords a particularly advantageous way of determining zero point or reference position index on the scale by ANDing the signals from sensors 50 and 52 which condition will occur only when the sensors are simultaneously aligned over light areas on their respective sensing strips. In the calibration of the scale, reference is also made to FIG. 4 which schematically illustrates the interrelationship between reference coils 60 which are fixed in the bottom wall of the lower casing 10 in alignment with the sensor unit 36. When the circuit is first activated, current is applied to the reference coils 60 and will overpower the earth's magnetic field so as to cause the magnets 16, which are symmetrically located with respect to the pivot point 14, to align with the field of the coils thereby causing the reference point on the disc 12 to rotate and become aligned with the sensor unit 36. When the reference point is reached, as sensed by alignment of the sensors 50 and 52 simultaneously over the light areas on the disc, the current in the reference coils is removed and the disc is then free to rotate and align itself with the earth's magnetic field.

Figure 6:
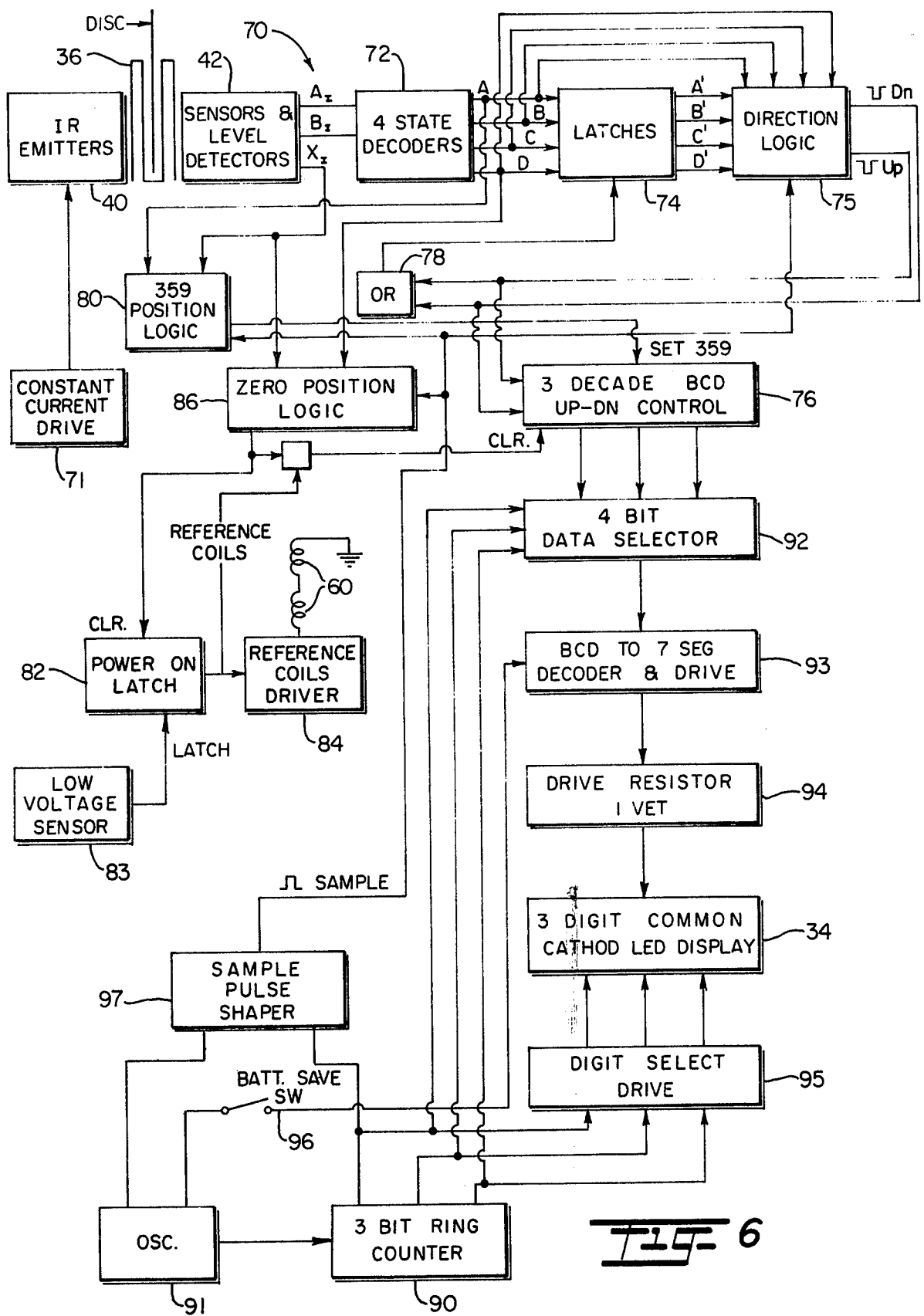
FIG. 6 is a block diagram illustrating the circuitry employed between the sensor outputs and a digital display in the preferred embodiment of the present invention.

FIG. 6 schematically illustrates the manner in which the digital compass of the present invention employs incremental encoding through the interrelationship of the disc 12, sensor unit 36 and logic current 70 both for establishing the zero or reference point and for counting the angular displacement from that zero or reference point. In FIG. 6, the signal generated by the sensor 50 is represented as A1, the signal generated by sensor 51 is represented by B1 and the signal generated by the sensor 52 is represented as $X_1$. As shown, a constant current drive 71 applies power to the IR emiters 40 on one side of the sensor unit 36 so as to insure proper operation over a wide range of supply battery voltage. As indicated, the sensors 50 and 51 result in signals $A_1$ and $B_1$ after level detection and, because of their 90° displacement as described, can be decoded by the four-state decoder circuit 72 into four output signals designated A, B, C and D. Disc movement and direction of movement is determined by sampling and comparing the A, B, C and D outputs with the A', B', C' and D' outputs from the latching circuit block 74, the A', B', C' and D' signals being the stored outputs corresponding to the last sample time that a change took place. Specifically, the sequence of signals A, B, C and D will indicate the direction of movement: For instance, if signal B which is stored as B' had been present at the last sample time, but at the next sample time signal C was present, as seen from the timing diagrams of FIG. 5 this would indicate that the disc 12 had rotated one increment forward. However, if signal A were present at the next sample time instead of signal C, such would indicate that the disc had rotated one increment in reverse. Of course, if signal B were still present, no movement would have taken place. Thus, at the sample time, the direction logic determines if there has been movement and the direction of movement as well. If there has been any movement of the disc, a short up-pulse or down-pulse is generated by the direction logic 75 and is directed to a three decade up/down counter 76 as well as to an OR gate 78. The pulses applied to the up/down counter 76 cause it to count up or down depending upon the pulse received, and the pulses gated from the OR gate 78 cause the signals A, B, C and D that resulted in the up or down pulse to be gated into the latches block 74 for comparison with the condition that produced the last change as A', B', C' and D'. Thus, the A, B, C and D outputs are not clocked into the latches block until a clock signal is applied to the OR gate or clock for the latches block 74.

An important feature of the invention is the method of sampling which reduces errors caused by noise on the input lines. In effect, an erroneous signal could cause the counter 76 to count up or down between sampling periods; however, the system is self-correcting since if the noise pulse causing the erroneous up or down count is not present at the next sampling time the A, B, C and D inputs will return to their pre-noise or correct states and comparison of the next signal with the noise-induced state of the last sample will result in an up or down pulse to restore the pre-noise or correct state of the up/down counter 76.

Special circuitry is also employed for determining the zero point on the scale as well as to set the up/down counter 76 to the next number "359°" past "zero" as opposed to permitting the counter to advance to the number "999" as would normally be the case. Specifically, as referred to earlier, the zero position is sensed by ANDing the A1 and X signals from sensors 50 and 52. Similarly, in counting from zero to the 359° position (counterclockwise), the 359° position is sensed by ANDing the X1 and B signals which produces a special count or output to the up/down counter through the 359° position logic circuit 80 thereby causing it to advance to the number 359 instead of "999". This avoids use of additional circuitry which would otherwise be required to cause the up/down counter to advance from "999" to "359". The counter is synchronized each time that the disc rotates either through the zero position or the 359 position so that if error should occur the effect would not be cumulative.

It will be noted further that in calibrating the instrument, a power-on latch 82 from low voltage sensor 83 is forced into a state causing current to pass through the reference coils 60 via reference coils driver 84. In addition, a Clear signal is applied by the power-on latch 82 to the up/down counter 76. When the reference position is reached as described, the zero position logic circuit 86 senses the zero or reference position by ANDing the $A_1$ and $X_1$ signals so as to result in a Clear signal applied to the power-on latch 82 at the sample time. The Clear signal is thereby released to the up/down counter and the reference coils current removed whereupon the circuit will then count the increments moved from the reference position.

Conventional circuitry is employed in combination with that described for accepting information from the up/down counter and displaying that information on the display 34. Specifically, for the purpose of illustration, a three-digit common cathode LED display 34 is employed, the segment input lines to each digit being common to all digits. As a result, the digit must be selected by grounding the cathodes associated with the desired digit. A three-bit ring counter 90 driven by an oscillator 91 alternately drives each digit in a cyclic fashion; namely, digit "1", digit "2", digit "3", etc.

through a digit select drive 95. Of course, when digit 1 is selected, the information to be displayed by digit 1 must simultaneously be gated to digit 1. A four-bit data selector 92 is also driven from the ring counter and selector allows the BCD data for the selected digit to be applied to the BCD to seven segment decoder represented at 93. Decoder 93 translates the BCD signals to seven segment drive signals through drive resistor network 94 and into a three-digit common cathode LED display 34. The time shared multiplexed operation of the digits as described is performed at a sufficiently high rate to prevent flicker, such as, at a rate on the order of 1 $Kh_z$ rate. Preferably the sample pulse is derived by gating signals from the oscillator and ring counter through a sample pulse shaper 97 so as to produce a twelve microsecond, 1 $Kh_z$ sample pulse to the zero position logic 86 and 359° position logic 80, as illustrated, together with the direction logic circuit 75. Display brightness is regulated by the duty cycle modulation of the blanking input to the segment decoder 93, the brightness being selected by a battery save switch 96.

In the operation and use of the compass, the cover is opened and normally extended in a direction and at an angle to the casing such that the display can be easily read in the display window while sighting along the sight member 32 and sight line 29' of the cover 24. In order to compensate for declination, a manual adjustment knob, not shown, is provided to rotate the azmuth ring the necessary number of degrees to align the sight line 29' as well as magnetic north on the azimuth ring with a fixed reference point on the casing. This will also serve to properly affix the aperture plate so that its reference position is properly aligned with magnetic north, and the magnetic needle or pointer P with zero on the azimuth ring when the sight is aligned with true north. This is all in accordance with conventional practice and, once declination is set for a given locale, generally it need not be readjusted. In order to take a compass reading, power is turned on and as described the reference coils 60 initially will energize the floating magnets 16 on the disc 12 thereby causing it to become aligned with the reference coils 60 and to align the zero position on the digit code strip 49 with the reference position on the aperture plate 37. Once the reference positions are aligned, the reference coils are automatically deenergized and the disc 12 is free to rotate in the direction of the object sighted. The digital display 34 will reflect both the number of degrees and direction of displacement away from the reference position of the compass reading, taking some care to hold the casing in a horizontal or level position. In this connection however the disposition of the disc 12 with respect to the aperture plate 37 is such that some tilt away from exact horizontal is permitted without altering or affecting the accuracy of the reading, since the opening slot 38 between the upper and lower surfaces of the aperture plate 37 will permit limited tilting movement of the disc and collimation of the light from one side of the plate to the other and will afford greatly increased accuracy in reading notwithstanding slight tilting or inclination of the disc. In order to take a bearing on another object; i.e., to determine the direction from one object to another, it is merely necessary to sight the compass toward the other object without returning to the zero or reference position. The incremental encoding circuit will in the manner described sense both the direction and extent of angular displacement with the digital display providing a numerical indication of the compass reading for the second object.

In the event that the compass is displaced in a counterclockwise direction through the zero or reference position, the counting circuit is automatically responsive to displacement from zero to 359° so as to numerically advance the digital display from "zero" to "359" and thereafter count down to the compass reading representing the angular displacement away from 0°.

Again, the digital compass of the present invention and the incremental encoding technique employed have other useful applications than specifically for compass readings, although it is best exemplified by its use in a portable, handheld digital compass as described. Accordingly, it is to be understood that various modifications and changes can be made in the present invention and its applications to particular uses without departing from the scope thereof as defined by the appended claims.

What is claimed is:

1. In a digital compass, encoding means for converting compass readings into a numerical display corresponding to the directional displacement of said compass, comprising:
   a rotatable disc including means orienting a radius of said disc in alignment with the earth's magnetic field, said disc having a reference position index and a digit code strip divided into equally spaced increments representing degrees of angular displacement away from said reference position index,
   a sensing unit operative to generate a combination of signals and including a reference position sensor operative to generate a signal in response to alignment of said reference position sensor with respect to said reference position index so as to define a reference position, said combination of signals representing the direction and number of increments of movement of said code strip away from said reference position,
   decoding means including counting means operative in response to the combination of signals generated by said sensor unit to count up or down in accordance with the direction and number of increments of movement of said digit code strip, and
   reference position control means responsive to receipt of a reference position signal to clear said counting means.

2. In a digital compass according to claim 1, said reference position index being in the form of a second code strip spaced from said first digit code strip.

3. In a digital compass according to claim 1, said digit code strip arranged to extend circumferentially of said disc and divide it into increments representing degree readings from 0° to 360°, and means associated with said counting means responsive to movement of said digit code one increment from 0° to 359° to cause said counting means to be advanced to a position numerically representing 359.

4. In a digital compass according to claim 1, said digit code strip being in the form of a circumferentially extending strip provided with alternate transparent and opaque areas representing the increments of movement of said code strip, and said sensing unit being defined by light sensitive detectors operative to generate electrical signals in response to movement between a transparent and opaque section on said digit code strip.

5. In a digital compass according to claim 4, there being a pair of light sensitive detectors arranged an odd number of increments apart so as to generate electrical signals in out-of-phase relation to one another in response to movement of said digit code strip in either direction, the phase relationship between the signals generated by said light sensitive detectors operative to indicate the direction of movement of said digit code strip with respect to its position when said reference position sensor is aligned with said reference position index.

6. In a digital compass according to claim 5 said reference position sensor comprising a reference position light sensitive detector aligned with a reference position indicating strip defining said reference position index, said reference position light sensitive detector generating a signal in response to movement of a transparent and an opaque section which together define said reference position index on said reference position indicating strip past said reference position indicator.

7. In a digital compass according to claim 1, including reference coils associated with said orienting means on said disc energized in response to initial application of power to said counting means to cause said digit code strip to advance to a position aligning its reference position index with said reference position sensor, said reference coils automatically de-energized in response to alignment between said reference position index and said reference position sensor whereupon said disc is free to align itself with the earth's magnetic field, said orienting means being at least one magnet.

8. In a digital compass according to claim 1, said reference sensor operative to generate a first electrical signal representing only the reference or zero position and a second electrical signal representing the first incremental displacement in either direction from the reference position.

9. A digital compass comprising in combination:
a circular scale having magnetic means adapted to orient said scale in alignment with the earth's magnetic field and a code strip thereon comprising alternate light transparent and opaque sections divided into equally spaced increments on said scale,
a sensing member including first and second light sensing means aligned with said code strip and spaced an odd number of increments apart with respect to said code strip whereby to generate signals in out-of-phase relation to one another in response to movement of said alternate light transparent and opaque sections across said light sensing means, and reference position sensing means for generating a signal in response to alignment of said code strip with a predetermined reference position,
decoder means for generating a combination of signals for each signal generated by said first and second light sensing means,
means ANDing the combination of signals generated by said decoding means with the signal received from said reference position sensing means,
means for storing each combination of signals received from said decoding means for comparison with each next combination of signals and to generate an output pulse representing the direction of movement of said scale based on a comparison of each successive combination of signals generated, and
counting means adapted to numerically count up or down in accordance with the output pulse received from said comparison means.

10. A digital compass according to claim 9, including reference coils associated with magnets on said disc energized in response to initial application of power thereto to cause said digit code strip to advance to its reference position, said reference coil means being automatically de-energized in response to said strip being in its reference position whereupon said disc is free to align itself with the earth's magnetic field.

11. A digital compass according to claim 9, said reference position sensing means operative to generate one electrical signal representing only the reference or zero position and another electrical signal representing the first incremental displacement in either direction from the reference position.

12. A digital compass according to claim 9, said digit code strip arranged to extend circumferentially of said disc and divide it into increments representing degree readings from 0° to 360°, and means associated with said counting means responsive to movement of said digit code one increment from 0° to 359° to cause said counting means to be advanced to a position numerically representing 359.

13. A digital compass according to claim 9, said reference position being defined by a second code strip radially spaced from said first digit code strip and having a transparent portion thereon aligned with said reference position sensing means at the reference position.

14. A digital compass according to claim 13, said reference position sensing means defined by a reference position light-sensitive detector aligned with said second code strip to generate a signal in response to movement of said transparent portion across said reference position detector.

15. A digital compass according to claim 9, said sensing member defined by a pair of mounting plates extending above and below said disc in closely spaced, parallel relation thereto, said first and second light sensing means and said reference position sensing means each defined by a light emitter in one of said mounting plates and a light detector in the other of said mounting plates, and light collimating means between each of said respective emitters and detectors.

16. A digital compass comprising in combination:
a rotatable circular scale having magnetic means adapted to orient said scale in alignment with the earth's magnetic field, a first digit code strip thereon comprising alternate light transparent and opaque sections divided into equally spaced degree increments on said scale from 0° to 360°, and a second code strip spaced radially of said first code strip having a transparent reference position thereon,
a sensing member including first and second light sensing means aligned with said first code strip and spaced an odd number of increments apart with respect to said code strip whereby to generate signals in out-of-phase relation with one another in response to movement of said alternate light transparent and opaque sections across said light sensing means, and reference position light sensing means aligned with said second code strip for generating a reference signal in response to alignment with the transparent reference position,
decoder means for generating a combination of signals for each signal generated by said first and second light sensing means, means ANDing the combination of signals generated by said decoding means when a signal is received from said reference position sensing means, means for storing each combination of signals received from said decoding means for comparison with each next combination of signals and to generate an output pulse representing the direction of movement of said scale based on a comparison of each successive combination of signals generated, counting means adapted to numerically count up or down in accordance with the output pulse received from said comparison means, and first logic means for clearing said counting means to zero in response to said reference signal, and second logic means for advancing said counting means to "359" when said scale is rotated one increment from 0° to 359°.

* * * * *